(12) United States Patent
Gundale et al.

(10) Patent No.: US 6,649,325 B1
(45) Date of Patent: Nov. 18, 2003

(54) THERMALLY CONDUCTIVE DIELECTRIC MOUNTS FOR PRINTED CIRCUITRY AND SEMI-CONDUCTOR DEVICES AND METHOD OF PREPARATION

(75) Inventors: Benjamin P. Gundale, St. Louis Park, MN (US); Sanjay Misra, Shoreview, MN (US)

(73) Assignee: The Bergquist Company, Chanhassen, MN (US)

( * ) Notice: Subject to any disclaimer, the term of this patent is extended or adjusted under 35 U.S.C. 154(b) by 111 days.

(21) Appl. No.: 09/865,778

(22) Filed: May 25, 2001

(51) Int. Cl.[7] .............. G03C 5/00; H05K 1/00; H05K 1/03; H01B 1/02
(52) U.S. Cl. ............ 430/311; 430/320; 430/322; 430/330; 428/901; 174/250; 174/255; 252/518.1; 252/516
(58) Field of Search ................ 430/311, 320, 430/322, 330; 428/901; 174/250, 255; 252/518.1, 516

(56) References Cited

U.S. PATENT DOCUMENTS

| | | | |
|---|---|---|---|
| 3,793,106 A | * | 2/1974 | Grunwald et al. ......... 156/155 |
| 4,520,067 A | | 5/1985 | Harris et al. |
| 4,550,140 A | | 10/1985 | Rimsa et al. |
| 4,764,327 A | | 8/1988 | Nozaki et al. |
| 5,529,836 A | | 6/1996 | Afzali-Ardakani et al. |
| 5,538,789 A | * | 7/1996 | Capote et al. ............. 428/344 |
| 5,565,267 A | | 10/1996 | Capote et al. |
| 5,827,907 A | | 10/1998 | Gotro et al. |

* cited by examiner

Primary Examiner—Mark F. Huff
Assistant Examiner—Deborah Chacko-Davis
(74) Attorney, Agent, or Firm—Haugen Law Firm PLLP

(57) ABSTRACT

Methods and formulations for use in preparing thermally conductive dielectric mounts for heat generating semi-conductor devices and associated circuitry. The formulations include a thermoplastic resin selected from the group consisting of polysulfone, poly-ethersulfone, poly-phenylsulfone, and poly-etherimides, with these resins being applied as a dispersion onto the surfaces of opposed metallic members. The dispersion is dried and thereafter treated under heat and pressure at temperatures greater than the glass transition temperature under unit pressures of between 100 psi and 800 psi and for periods in excess of about 30 minutes. The polymer resin may be filled with solid particulate such as alumina and/or boron nitride.

10 Claims, 3 Drawing Sheets

THERMALLY CONDUCTIVE DIELECTRIC MOUNTS FOR PRINTED CIRCUITRY AND SEMI-CONDUCTOR DEVICES AND METHOD OF PREPARATION

BACKGROUND OF THE INVENTION

The present invention relates generally to improved methods and formulations for use in preparing thermally conductive dielectric mounts for printed circuits including substrates used in their production, and including dielectric layers for improving heat transfer from the circuit elements and from heat generating semi-conductor devices. Thermal energy generated during operation of these devices must be dissipated through transfer to a heat spreader or dissipater such as a heat sink or heat spreader. More specifically, the present invention relates to techniques employed for preparation of mounting pads for circuitry and components, the pads being highly thermally conductive and having exceptional dielectric properties. Those properties are combined with exceptional mechanical properties as well. In particular, the techniques of the present invention facilitate the fabrication of a substrate to serve as a mounting surface for circuits and semi-conductor devices, wherein there is a substantial reduction in the thermal impedance normally associated with the interface created between dissimilar layers. The processes and formulations of the present invention utilize thermoplastics having high glass transition temperatures, such as those preferably in the range of 170° C. and higher, thus serving to preserve the exceptional thermal, electrical, and mechanical properties when operating at elevated temperatures.

Thermal properties of substrates and/or mounting pads are typically measured in and through the bulk material. As device and system technology has evolved, efforts have been focused upon the utilization of thin interface surfaces, thus enhancing the rate of heat transfer through the substrate. Because of the improved and enhanced capability of semi-conductor devices, and given the performance limitations imposed by the dielectric properties of the substrate material, a lower limit on substrate thickness has typically been recognized. Due to the typical lack of uniformity in the thermal properties of the polymer layer or component, such as introduction of pinholes and voids, a practical design parameter will include a significant safety factor to preserve the dielectric characteristics. Another feature recognized with the utilization of thin polymer films is the importance of considering the significance of interfacial and/or contact resistance. In other words, in the interests of decreasing the overall thermal impedance of a mounting system, as the thickness of the polymeric component decreases, the importance and/or significance of contact resistance correspondingly increases. It has been found that in accordance with the present invention, interfacial contact resistance is lowered substantially, while at the same time uniformity of the polymeric layer is significantly increased.

The dielectric layers of the present invention are typically interposed between highly adherent metallic layers. The steps in the process include the creation of an enhanced bond between each of the metallic foil layers and the centrally disposed thermoplastic layer, with the processing steps further assuring a formation and/or creation of a thermoplastic dielectric layer which is highly integral and free of pinholes or voids and which has low interfacial or contact resistance at the foil/polymer bond. In other words, one highly advantageous feature of the present invention is the creation of a bond between the metallic foil layer and the polymeric dielectric layer which has highly desirable thermal conducting characteristics. In particular, this bond has demonstrated a significant reduction in impedance, it being believed that this reduction is due to the creation of surface-to-surface foil/polymer bond with low contact resistance, with the contact resistance at such interfaces otherwise being responsible for an increase in overall thermal resistance across a multi-layer assembly, such as those present in many multi-layer arrangements.

In the past, various techniques have been employed for the incorporation of thermoplastic polymeric dielectric layers between opposed metallic foils. In most typical applications, the dielectric and/or polymeric core has consisted of epoxies, bismaleimides, polyesters such as polyethylene terephthalate and polyethylene napthalate as well as a certain phenolics and the like. While such materials have provided certain advantages and benefits, they were not without accompanying disadvantages, such as, for example, low thermal and moisture stability along with certain other relatively poor mechanical properties. Still other disadvantages included lack of integrity in the polymeric layer occasioned by the formation of pinholes and/or voids, as well as a relatively high interfacial thermal contact resistance resulting in greater thermal impedance across the interfaces and the assembly. It is now recognized that any lack of uniformity in surface wetting between the metallic foil and polymeric dielectric layers can dramatically reduce the performance and effectiveness of the assembly, including the semi-conductor devices and associated circuitry due to a relatively high thermal impedance and/or a loss or compromise in the dielectric properties. Poor performance in either property may result in the production of unacceptable systems, subsystems and/or components.

The present invention directed primarily to the preparation of thermoplastic metal-clad laminates for use in circuitry which includes heat generating semi-conductor components. The metallic foil component typically comprises copper or aluminum, with the thermoplastic comprising a polymer composition with a high glass transition temperature selected from the group consisting of polysulfone (PS), poly-ethersulfone (PES), poly-phenylsulfone (PPSU) and poly-etherimides (PI). Each of these thermoplastic materials is commercially available and used in the production of high performance engineering plastics. In addition to their highly desirable thermal and electrical properties, these thermoplastics, when treated in accordance with the present invention, exhibit high chemical resistance and a relatively low modulus, particularly when compared with typically employed thermosetting polymers. The thermoplastic polymers utilized in accordance with the present invention are preferably blended or filled with thermally conductive particulate, such as, for example, alumina, boron nitride, or mixtures thereof. Other fillers are also suitable, including aluminum nitride, silicon carbide, silicon nitride and the like.

SUMMARY OF THE INVENTION

In accordance with the present invention, a printed circuit board is prepared pursuant to the following steps or process operations. Initially, a performance thermoplastic-based resin dispersion is prepared, with the dispersion preferably comprising between about 10–25% resin balance solvent or carrier. Suitable solvents or carriers include those typical of the flex circuit industry where thermoplastics are utilized extensively, such as gamma butyrolactone. Thereafter, the dispersion is applied as a coating onto the surfaces of each of a pair of metallic substrates, with the coatings thereafter being dried. Upon release of the solvent or carrier, a moderately adherent film is formed on the surface of the substrate. The coated substrates are then clamped in face-to-face contact while under pressure, and exposed to a temperature of between about 200° C. and 350° C. for a period of greater than about 30 minutes. During the heating cycle, the coated metallic substrates continue to be subjected to a force sufficient to create unit pressures of between about 100 psi and 800 psi. The thermal exposure time taken together with the application of force results in the creation of a metal/plastic/metal laminate with not only exceptional thermal and electrical properties, but also highly desirable mechanical properties, including a relatively low modulus and high chemical resistance. The selection and utilization of a pair of coated metallic substrates which are bonded together under heat and pressure results in the creation of a highly uniform polymeric layer uniformly bonded at its opposed surfaces to metallic foil. The interfacial bond is both homogenous and uniform.

Therefore, it is a primary object of the present invention to provide improved printed circuit substrates utilizing a thermoplastic polymer having a high glass transition temperature, with the polymer exhibiting exceptional thermal, electrical and mechanical properties.

It is a further object of the present invention to provide an improved printed circuit board comprising a metal/plastic/metal laminate wherein the plastic component is a thermoplastic polymer selected from the group consisting of polysulfone (PS), poly-ethersulfone (PES), polyphenylsulfone (PPSU), and poly-etherimides (PI). It is a still further object of the present invention to provide an improved polymeric core for a metal/plastic/metal printed circuit board wherein the plastic component is a thermoplastic polymer having a high glass transition temperature, and with the polymer being loaded with a thermally conductive particulate filler such as alumina, boron nitride, aluminum nitride, silicon carbide, silicon nitride or mixtures thereof.

Other and further objects of the present invention will become apparent to those skilled in the art on a review of the following specification, dependant claims and accompanying drawings.

IN THE DRAWINGS

DESCRIPTION OF THE PREFERRED EMBODIMENT

Figure 1:
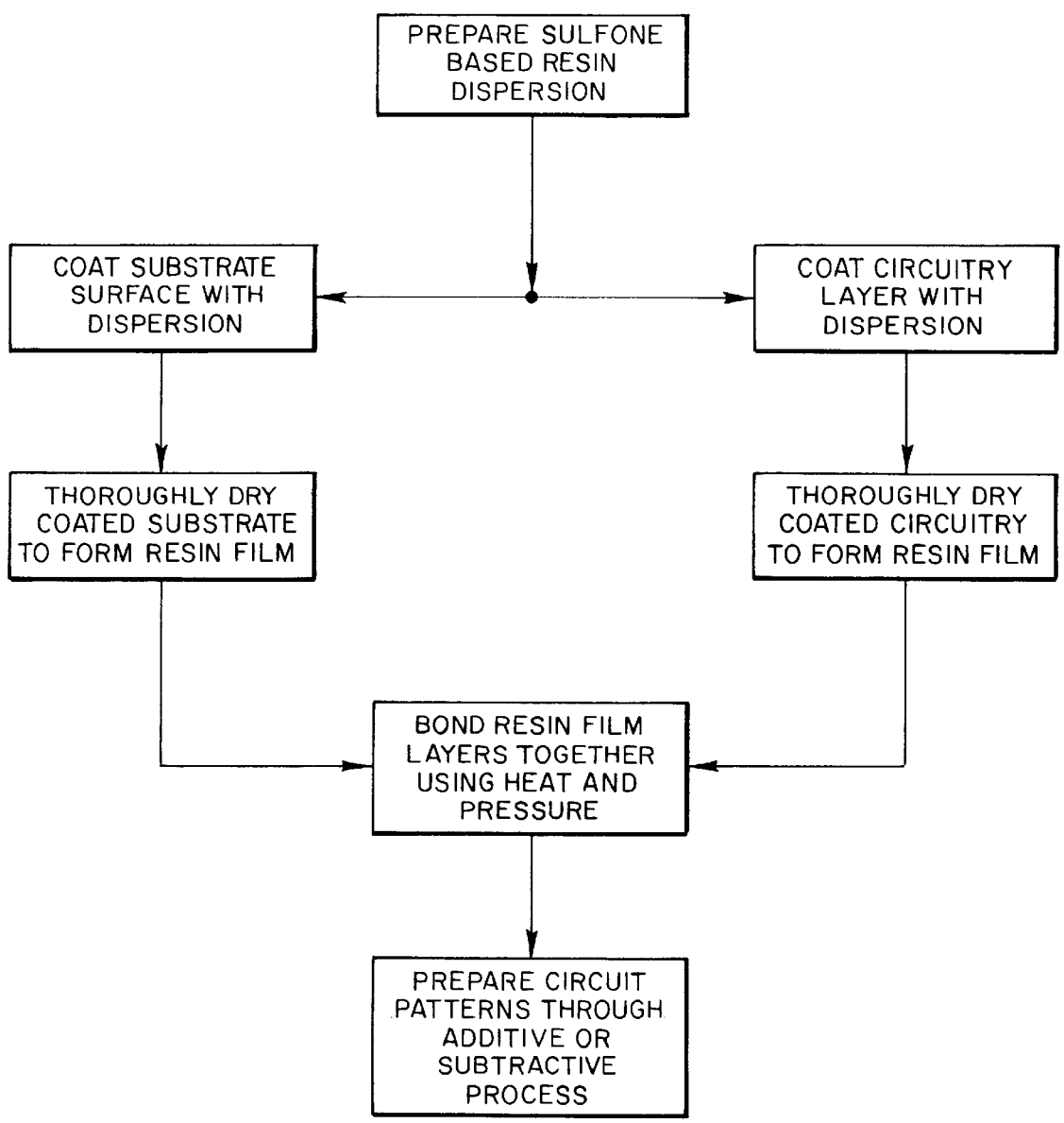
FIG. 1 is a flow chart illustrating the steps undertaken in preparing a typical printed circuit board pursuant to the present invention, and with the polysulfone based polymer being securely and uniformly bonded to opposed metallic foil layers.

In accordance with the preferred embodiment of the present invention, the following examples are given:

EXAMPLE I

Polysulfone thermoplastic polymer pellets are dispersed in solvent and blended with boron nitride to form a dispersion, pursuant to the following formulation:

| polysulfone | 70 vol. % solids |
| powdered boron nitride, average particle size 12 microns | 30 vol. % solids |
| gamma butyrolactone | sufficient to prepare dispersion with 25% solids |

The dispersion is then coated onto the surface of 90 micron copper foil and thereafter subjected to drying to remove the solvent or liquid phase carrier. Following drying, the layers are clamped in surface-to-surface contact with a force sufficient to create a unit pressure of 300 psi, with this pressure being maintained during the subsequent heating cycle. The heating cycle includes subjecting the clamped assembly to a temperature of 300° C. for one hour. At the end of the heating cycle, the laminate assembly comprising the printed circuit is removed and permitted to cool. The resulting assembly is desirable for the preparation of finished circuit patterns through subtractive processes.

The thermoplastic polymer in the finished laminate has a glass transition temperature of 180° C. The thermal treatment causes the individual polymer surfaces to become thoroughly bonded together, with the thermal treatment causing the individual polymer layers to become commingled, one with the other so as to become homogenized. This feature is obtained without plastic flow of the polymer. The resultant thermal conductivity of the dielectric is 1.3W/m.K with an accompanying 900 peel adhesion of 6 lb/lineal inch. Because of its exceptional thermal, dielectric and mechanical properties, printed circuit devices and mounting pads fabricated from this laminate find unique application in certain extreme temperature applications, such as for example, for direct mounting onto the surface of an internal combustion engine block.

EXAMPLE II

Pellets of poly-ethersulfone thermoplastic polymer is dispersed in solvent and blended with alumina to form a dispersion, pursuant to the following formulation:

| poly-ethersulfone | 55 vol. % solids |
| powdered alumina, average particle size 4 microns | 45 vol. % solids |
| gamma butyrolactone | sufficient to prepare dispersion with 25% solids |

The dispersion is then coated onto the surface of 90 micron copper foil and thereafter subjected to drying to remove the solvent or liquid phase carrier. Following drying, the layers are clamped in surface-to-surface contact with a force sufficient to create a unit pressure of 350 psi, with this pressure being maintained during the subsequent heating cycle. The heating cycle includes subjecting the clamped assembly to a temperature of 300° C. for one hour. At the end of the heating cycle, the laminate assembly comprising the printed circuit is removed and permitted to cool. The resulting assembly is desirable for the preparation of finished circuit patterns through subtractive processes.

The thermoplastic polymer in the finished laminate has a glass transition temperature of 220° C. The thermal treatment causes the individual polymer surfaces to become thoroughly bonded together, with the thermal treatment causing the individual polymer layers to become commingled, one with the other so as to become homogenized. This feature is obtained without plastic flow of the polymer. The resultant thermal conductivity of the dielectric is 1.1 W/m.K with an accompanying 90° peel adhesion of 19 lb./lineal inch. Because of its exceptional thermal, dielectric and mechanical properties, printed circuit devices and mounting pads fabricated from this laminate find unique application in certain extreme temperature applications, such as for example, for direct mounting onto the surface of an internal combustion engine block.

EXAMPLE III

Pellets of poly-phenylsulfone thermoplastic polymer is dispersed in solvent and blended with aluminum nitride to form a dispersion, pursuant to the following formulation:

| | |
|---|---|
| poly-phenylsulfone | 45 vol. % solids |
| powdered aluminum nitride, average particle size 4 microns | 55 vol. % solids |
| gamma butyrolactone | sufficient to prepare dispersion with 20% solids |

The dispersion is then coated onto the surface of 90 micron copper foil and thereafter subjected to drying to remove the solvent or liquid phase carrier. Following drying, the layers are clamped in surface-to-surface contact with a force sufficient to create a unit pressure of 500 psi, with this pressure being maintained during the subsequent heating cycle. The heating cycle includes subjecting the clamped assembly to a temperature of 300° C. for one hour. At the end of the heating cycle, the laminate assembly comprising the printed circuit is removed and permitted to cool. The resulting assembly is desirable for the preparation of finished circuit patterns through subtractive processes.

The thermoplastic polymer in the finished laminate has a glass transition temperature of 220° C. The thermal treatment causes the individual polymer surfaces to become thoroughly bonded together, with the thermal treatment causing the individual polymer layers to become commingled, one with the other so as to become homogenized. This feature is obtained without plastic flow of the polymer. The resultant thermal conductivity of the dielectric is 2.0 W/m.K with an accompanying 900 peel adhesion of 13 lb./lineal inch. Because of its exceptional thermal, dielectric and mechanical properties, printed circuit devices and mounting pads fabricated from this laminate find unique application in certain extreme temperature applications, such as for example, for direct mounting onto the surface of an internal combustion engine block.

THE DEVICE APPLICATIONS

Figure 2:
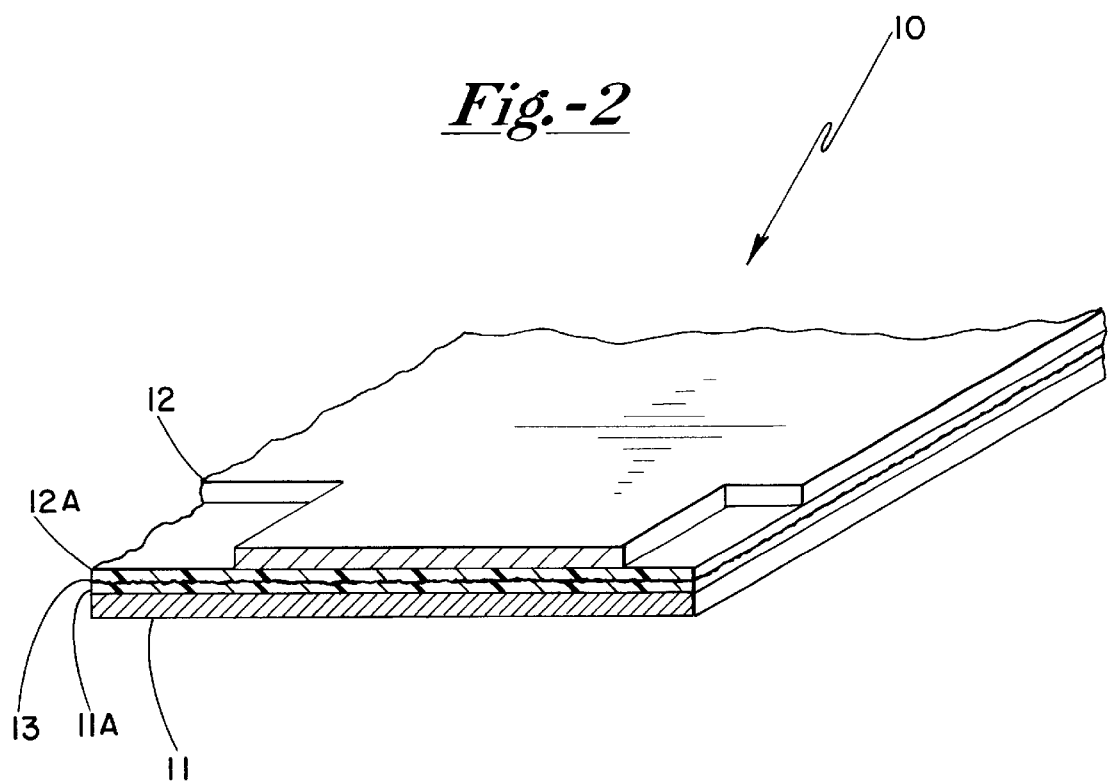
FIG. 2 is a perspective view, partially in section, and illustrating a typical printed circuit laminate in accordance with the present invention.
Figure 3:
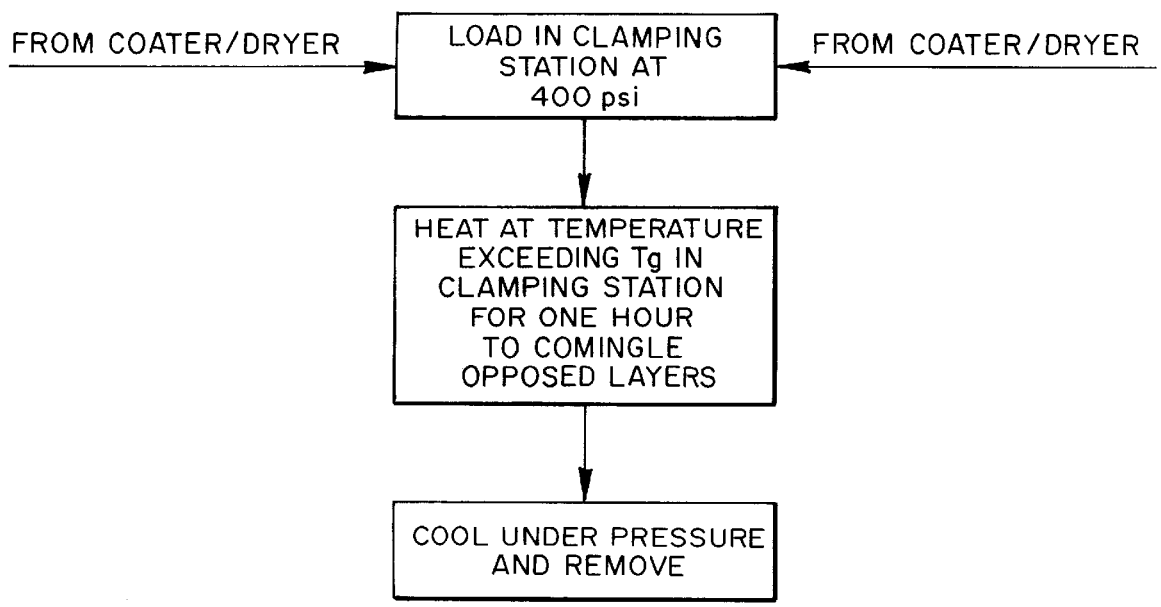
FIG. 3 is a detail flow chart supplemental to the chart in FIG. 1, and illustrating more detailed features of the resin to metal bonding operation.

With attention being directed to FIG. 2, a typical application of the laminate structure of the present invention is illustrated. In this connection, laminate member generally designated 10 comprises a three layer member including a base layer 11 and a top layer 12, between which is interposed a polymeric layer 13. Polymeric layer 13 is preferably prepared in accordance with Examples I–III hereinabove.

In its preparation, each of the metal layers 11 and 12 was provided with an adherent coating of polymer of the type of Example I, with these polymeric layers being shown at 11A and 12A. In the course of the subsequent operations, layers 11 and 12 were thermally treated and became merged into a single layer as identified at 13. Subsequent to their preparation, and through subtractive processes, zones were cut and/or removed from metallic layer as shown at the forwardly projecting portions of layer 12.

GENERAL COMMENTARY

It will be appreciated that the amount of thermally conductive particulate, which is loaded into the thermoplastic matrix, may be present in fractions varying from 5% to 80% by volume, balance polymer. In each of the Examples I–III, the particulate fillers are interchangeable, with substantially similar results being achieved. By way of example, the device obtained pursuant to Example I may be filled with anyone of the other particulates listed hereinabove, such as alumina, aluminum nitride, silicone carbide, or silicone nitride.

While aluminum, copper, or copper foil are frequently utilized as the metallic layer, other metallic layers may be satisfactorily utilized as well, with these alternative metallic layers being laminates such as copper-Invar-copper or copper-molybdenum-copper. Additionally, a layer of aluminum-silicone carbide compounds may also be employed, with this material being, of course, commercially available.

It has been found that the high glass transition temperature properties of the various polysulfone and polymers contribute to the excellent long term stability in terms of electrical, thermal, and mechanical properties. Furthermore, these thermoplastic materials, when treated in accordance with the present invention, do not suffer from those disadvantages experienced with certain other dielectrics including, for example, excessively high modulus and lack of fracture toughness. Additionally, the interfacial bond between the resin and metal is such that thermal impedance frequently encountered at these interfaces is minimized. In addition, the bond strength between the layers is enhanced, with peel strengths ranging up to as high as 20 pounds per lineal inch.

In addition to a typical three layer laminate, the materials of the present invention find application in assemblies comprising a greater number of metallic foil or circuit layers, with certain of the same processing techniques being generally applicable. Because certain of the metallic foil layers will be embedded in the laminate between polymer layers, the process is modified so as to prepare the circuit layer with processes which are at least initiated or partially completed before exposing the assembly to the complete thermal cycles.

It will be appreciated that various modifications may be made from the illustrative examples given herein without departing from the spirit and scope of the present invention.

What is claimed is:

1. The method of preparing a thermally conductive circuit mounting pad for use in combination with heat generating semi-conductor devices which includes the steps of:

(a) preparing a dispersion of thermoplastic polymer resin having a glass transition temperature greater than 170° C. and selected from the group consisting of polysulfone (PS), poly-ethersulfone (PES), poly-phenylsulfone (PPSU), and poly-etherimides (PI);

(b) providing first and second metallic members, said first metallic member having a first side and a generally opposing second side, and said second metallic member having a first side and a generally opposing second side;

(c) applying a coating of said dispersion onto said first side of said first metallic member and said second side of said second metallic member;

(d) drying said dispersion coatings to create adherent thermoplastic films on the respective sides of said first and second metallic members;

(e) positioning said first and second metallic members such that said first side of said first metallic member is in facing relationship with said second side of said second metallic member such that the respective thermoplastic films are in face-to-face contact with one another to form a multiple metallic layer pad; and (f) subjecting said multiple metallic layer pad to a temperature above about 250° C., and an external pressure of between about 100 psi and 800 psi for a period of greater than 30 minutes to thereby cause said thermoplastic films to commingle and merge into a single uniform thermoplastic film that bondedly secures said two metallic members to one another.

2. The method of preparing a thermally conductive circuit mounting pad as in claim 1 wherein said thermoplastic polymer is loaded with a quantity of finely divided particulate filler selected from the group consisting of alumina, boron nitride, aluminum nitride, silicon carbide, silicon nitride and mixtures thereof.

3. The method of preparing a thermally conductive circuit mounting pad as in claim 2 wherein said filler is incorporated into said thermoplastic polymer in an amount ranging from between about 5% and 80% particulate filler.

4. The method of preparing a thermally conductive circuit mounting pad as in claim 2 wherein said filler has a particle size ranging from 3 to 100 microns.

5. The method of preparing a thermally conductive circuit mounting pad as in claim 1 wherein said metallic members are exposed to a typical subtractive process to form a circuit pattern, including the application of photo resist, acid etching of the exposed circuit and finally stripping off the photo resist.

6. The method of preparing a thermally conductive circuit mounting pad as in claim 1 wherein said metallic layer is selected from the group consisting of aluminum, steel, copper, aluminum-silicon carbide, copper-invar-copper, and copper-molybdenum-copper.

7. The method of preparing a thermally conductive circuit mounting pad as in claim 6 wherein a first of said metallic members has a thickness ranging from between about 25 microns and 400 microns.

8. The method of preparing a thermally conductive circuit mounting pad as in claim 6 wherein a second of said metallic members has a thickness ranging from between about 500 microns and 6300 microns.

9. The method of preparing a thermally conductive circuit mounting pad as in claim 1 wherein said multiple metallic layer pad has a thickness ranging from between about 550 and 7000 microns.

10. The method of preparing a thermally conductive circuit mounting pad as in claim 1 wherein said thermoplastic film has a thickness ranging from between about 20 microns and 300 microns.

* * * * *